(12) United States Patent
Itose et al.

(10) Patent No.: US 8,844,124 B2
(45) Date of Patent: Sep. 30, 2014

(54) OPERATION INSTRUCTION DISPLAY TECHNIQUE FOR AN ELECTRONIC COMPONENT MOUNTING SYSTEM

(75) Inventors: Kazuhiko Itose, Fukuoka (JP);
Kenichiro Ishimoto, Saga (JP);
Yoshiaki Awata, Fukuoka (JP); Hideki Sumi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 600 days.

(21) Appl. No.: 12/679,065

(22) PCT Filed: Oct. 7, 2008

(86) PCT No.: PCT/JP2008/002830
§ 371 (c)(1),
(2), (4) Date: Mar. 19, 2010

(87) PCT Pub. No.: WO2009/047892
PCT Pub. Date: Apr. 16, 2009

(65) Prior Publication Data
US 2010/0212151 A1    Aug. 26, 2010

(30) Foreign Application Priority Data
Oct. 9, 2007   (JP) ................ P2007-263077

(51) Int. Cl.
*H05K 3/30* (2006.01)
*H05K 9/00* (2006.01)

(52) U.S. Cl.
CPC .................... *H05K 9/00* (2013.01)
USPC ............... 29/832; 29/833; 29/834; 29/742; 700/121

(58) Field of Classification Search
CPC ... H05K 13/0452; H05K 13/04; H05K 13/08; H05K 13/0469; G05B 19/41805; G05B 2219/31449
USPC ........ 29/832–836, 709, 719–721, 740–743; 700/28, 96, 313, 121; 715/773, 715/744–747
See application file for complete search history.

(56) References Cited

U.S. PATENT DOCUMENTS 5,400,497 A * 3/1995 Watanabe et al. ............. 29/705
5,553,376 A * 9/1996 Solanki et al. ................ 29/833
(Continued)

FOREIGN PATENT DOCUMENTS

| JP | 2004-104075 A | 4/2004 |
|---|---|---|
| JP | 2004-282102 A | 10/2004 |

(Continued)

OTHER PUBLICATIONS

International Search Report for PCT/JP2008/002830.

*Primary Examiner* — Minh Trinh
(74) *Attorney, Agent, or Firm* — Pearne & Gordon LLP

(57) ABSTRACT

An electronic component mounting system and method is disclosed that can provide accurate operation instruction to a machine operator. The electronic component mounting system comprises a plurality of machines interlinked in series. A main screen, making up an operation instruction screen, is displayed on a display panel belonging to an operation target machine to be operated by the machine operator while a first sub-screen and a second sub-screen of the operation instruction screen are respectively displayed on display panels belonging to two adjacent machines placed adjacently on both sides of the operation target machine among the plurality of machines. Thus, even when a unit device has a small width such that a size restriction is imposed a display panel, accurate operation instruction, with a sufficient amount of information, can be provided by displaying the operation instruction screen on multiple display panels.

3 Claims, 7 Drawing Sheets

(56) References Cited

U.S. PATENT DOCUMENTS

| | | | |
|---|---|---|---|
| 5,727,311 A * | 3/1998 | Ida et al. | 29/832 |
| 7,142,936 B2 * | 11/2006 | Yokomori et al. | 700/97 |
| 7,965,179 B2 * | 6/2011 | Maida | 340/514 |
| 8,020,285 B2 * | 9/2011 | Nies et al. | 29/832 |
| 2011/0184548 A1 * | 7/2011 | Higashi et al. | 700/121 |

FOREIGN PATENT DOCUMENTS

| | | |
|---|---|---|
| JP | 2004-335888 A | 11/2004 |
| JP | 2005-158993 A | 6/2005 |
| JP | 2006-339244 A | 12/2006 |

* cited by examiner

M1~M5

(a)

(b)

OPERATION INSTRUCTION DISPLAY TECHNIQUE FOR AN ELECTRONIC COMPONENT MOUNTING SYSTEM

TECHNICAL FIELD

The present invention relates to an electronic component mounting system that manufactures a mounting board by mounting electronic components, which have been made by interlinking a plurality of electronic component mounting machines, on a board, as well as to an operation instruction method for use with an electronic component mounting system that provides a machine operator with instruction by displaying an operation instruction screen on a display panel of the electronic component mounting system.

BACKGROUND ART

An electronic component mounting system that manufactures a mounting board by mounting electronic components on a board is formed by interlinking a plurality of electronic component mounting machines, such as screen printers, pieces of electronic component mounting apparatus, and pieces of inspection apparatus. The component mounting machine is equipped with a display panel for providing a machine operator with various pieces of operation instruction in conjunction with an operation panel for letting the machine operator make an operation input (see Patent Document 1).

In relation to a recent form of manufacture of electronic devices, manufacture of small batches of a wide variety of products has become common, and a method commonly seen in connection with facility constitution is to construct an electronic component mounting system by interlinking a large number of small facilities with a view toward enhancing area productivity and flexibility (see Patent Document 2). In the example related art described in connection with Patent Document 2, a large number of thin unit devices having dimensions of the order of hundreds of millimeters in a direction of transport of a board are removably interlinked, to thus build up an electronic component mounting line.

Patent Document 1: Japanese Patent Document No. 3894208

Patent Document 2: JP-A-2004-104075

DISCLOSURE OF THE INVENTION

Problem that the Invention is to Solve

However, the facility formed from the thus-interlinked compact, thin unit devices, such as those mentioned above, encounters the following problems in providing the machine operator with operation instruction by way of the display panel. Specifically, specifics of operation instruction provided when the machine operator operates the respective devices have become more complicated than ever along with greater sophistication of facility function. On the contrary, the size of the display panel for displaying operation instruction screens tends to become smaller in conjunction with a reduction in facility size.

On this account, display capacity of the display panel becomes smaller than ever, so that it becomes impossible to display an operation instruction screen having a volume of information originally required to sufficiently convey instruction specifics. Thus, there arise cases where a simplified instruction screen is compelled to use. Such a simplified instruction screen encounters difficulty in letting the machine operator fully comprehend specifics in many cases. In particularly, when there is no alternatively way but to specify an inexperienced worker as a machine operator for reasons of personnel assignment, the simplified instruction screen induces a problem which will result from performance of inappropriate operation without accurate comprehension of operation instruction.

Means for Solving the Problem

An electronic component mounting system of the present invention is an electronic component mounting system that is formed by interlinking a plurality of electronic component mounting machines in series and that manufactures a mounting board by mounting electronic components on a board, wherein each of the electronic component mounting machines comprises a working operation mechanism that performs working operation for mounting an electronic component; a control section that controls the working operation mechanism; an operation section that is arranged on a machine side surface along a board conveying direction and that is equipped with a display panel for displaying a display screen including an operation instruction screen for a machine operator and an operation panel by way of which the machine operator makes an operation input to the control section; a storage section that stores image data pertaining to the operation instruction screen to be displayed on the display panel; and a display processing section that displays image data stored in the storage section on the display panel; and wherein the electronic component mounting system further includes display control means that controls the display processing section, to thus display the operation instruction screen pertaining to an operation target machine in accordance with a preset display format on at least two display panels including the display panel belonging to the operation target machine to be operated by the machine operator, among the plurality of electronic component mounting machines, and the display panel belonging to at least one of two machines adjacently placed on both sides of the operation target machine.

An operation instruction method for use with an electronic component mounting system of the present invention is an operation instruction method for use with an electronic component mounting system that manufactures a mounting board by mounting an electronic component on a board and that provides operation instruction to a machine operator by displaying an operation instruction screen on a display panel, wherein each of the electronic component mounting machines comprises a working operation mechanism that performs working operation for mounting an electronic component; a control section that controls the working operation mechanism; an operation section that is arranged on a machine side surface along a board conveying direction and that is equipped with a display panel for displaying a display screen including an operation instruction screen for a machine operator and an operation panel by way of which the machine operator makes an operation input to the control section; a storage section that stores image data pertaining to the operation instruction screen to be displayed on the display panel; and a display processing section that displays image data stored in the storage section on the display panel; and wherein the operation instruction screen pertaining to an operation target machine is displayed by means of control of the display processing section, in accordance with a preset display format and on at least two display panels including the display panel belonging to the operation target machine to be operated by the machine operator, among the plurality of electronic component mounting machines, and the display panel belonging to at least one of two machines adjacently placed on both sides of the operation target machine.

Advantage of the Invention

According to the present invention, in an electronic component mounting system formed by interlinking a plurality of machines in series, an operation instruction screen pertaining to an operation target machine is displayed in a preset display format on at least two display panels including a display panel belonging to the operation target machine to be operated by a machine operator, among a plurality of electronic component mounting machines, and a display panel belonging to at least one of two adjacent machines located on both sides of the operation target machine. Accurate operation instruction can be provided by displaying the operation instruction screen in sufficient amount of information.

DESCRIPTIONS OF THE REFERENCE NUMERALS AND SYMBOLS

1 ELECTRONIC COMPONENT MOUNTING SYSTEM
4 OPERATION SECTION
5 COMPONENT SUPPLY SECTION
6 TAPE FEEDER
7 TAPE REEL
9 BOARD
11 Y-AXIS MOVE TABLE
12 X-AXIS MOVE TABLE
13 MOUNTING HEAD
20 DISPLAY PANEL
21 OPERATION PANEL
22 SIGNAL TOWER
M1 TO M5 ELECTRONIC COMPONENT MOUNTING MACHINES
M* OPERATION TARGET MACHINE
M(R), M(L) ADJACENT MACHINE
MS MACHINE SIDE SURFACE

BEST MODE FOR CARRYING OUT THE INVENTION

Figure 1:
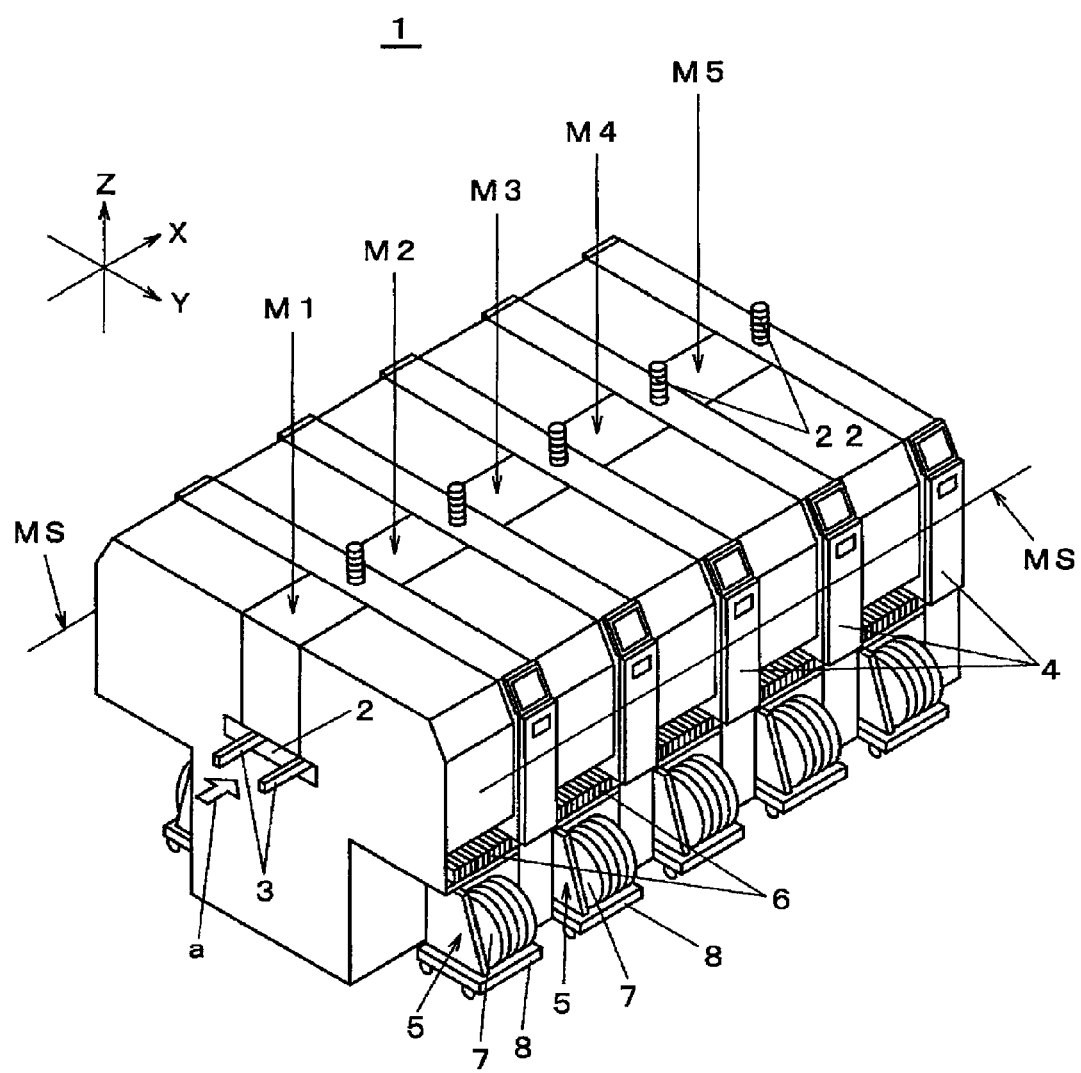
[FIG. 1] It is an oblique perspective view of an electronic component mounting system of an embodiment of the present invention.
Figure 2:
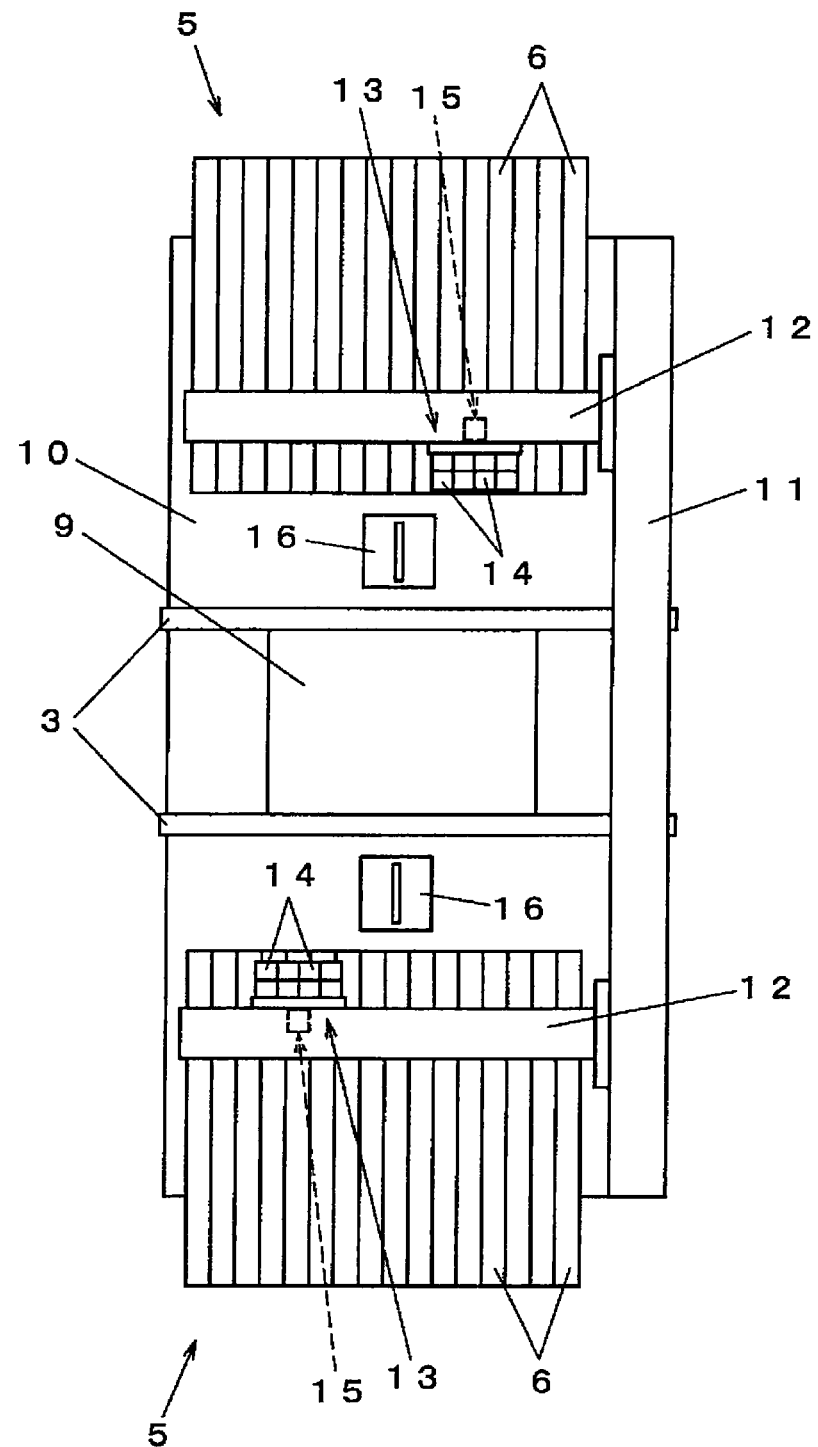
[FIG. 2] It is a plan view of electronic component mounting machines building up the electronic component mounting system of the embodiment of the present invention.
Figure 3:
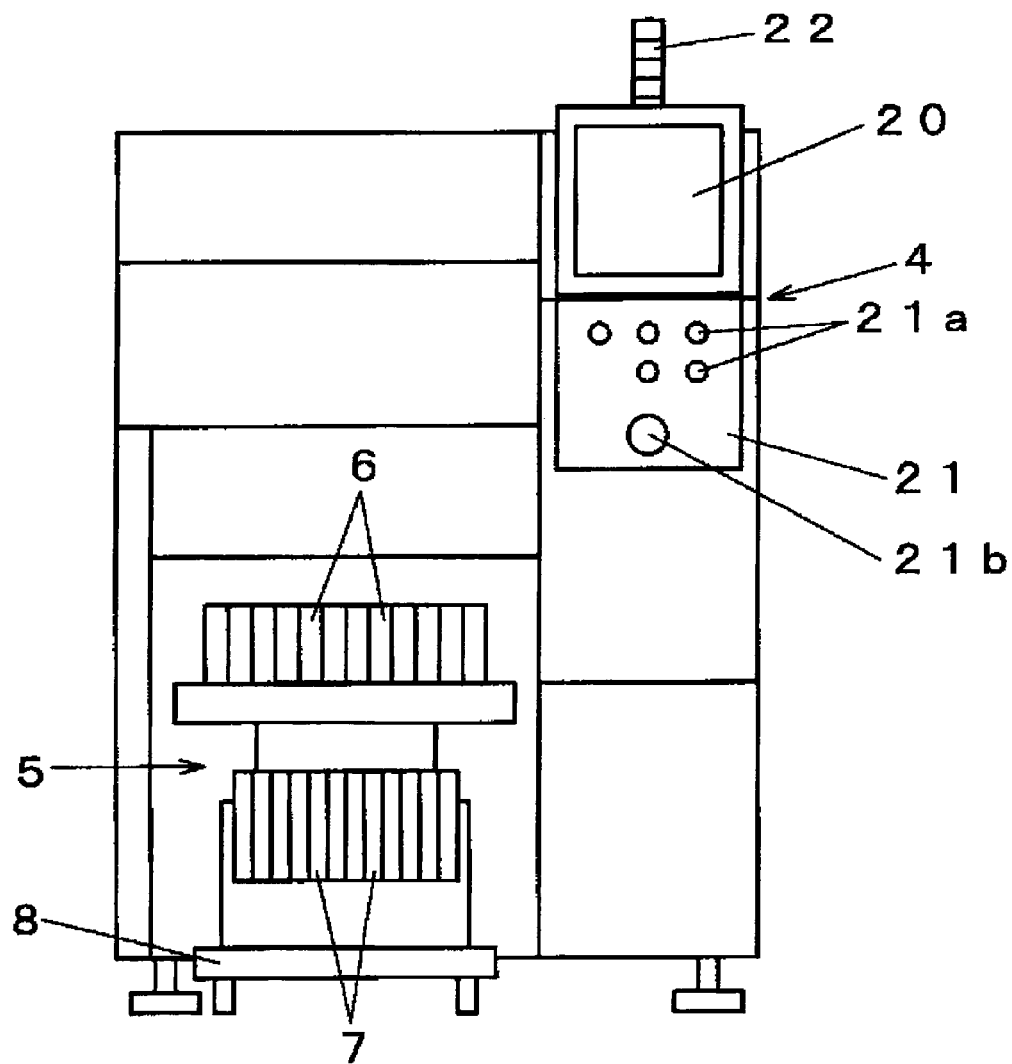
[FIG. 3] It is a side view of the electronic component mounting machines building up the electronic component mounting system of the embodiment of the present invention.
Figure 4:
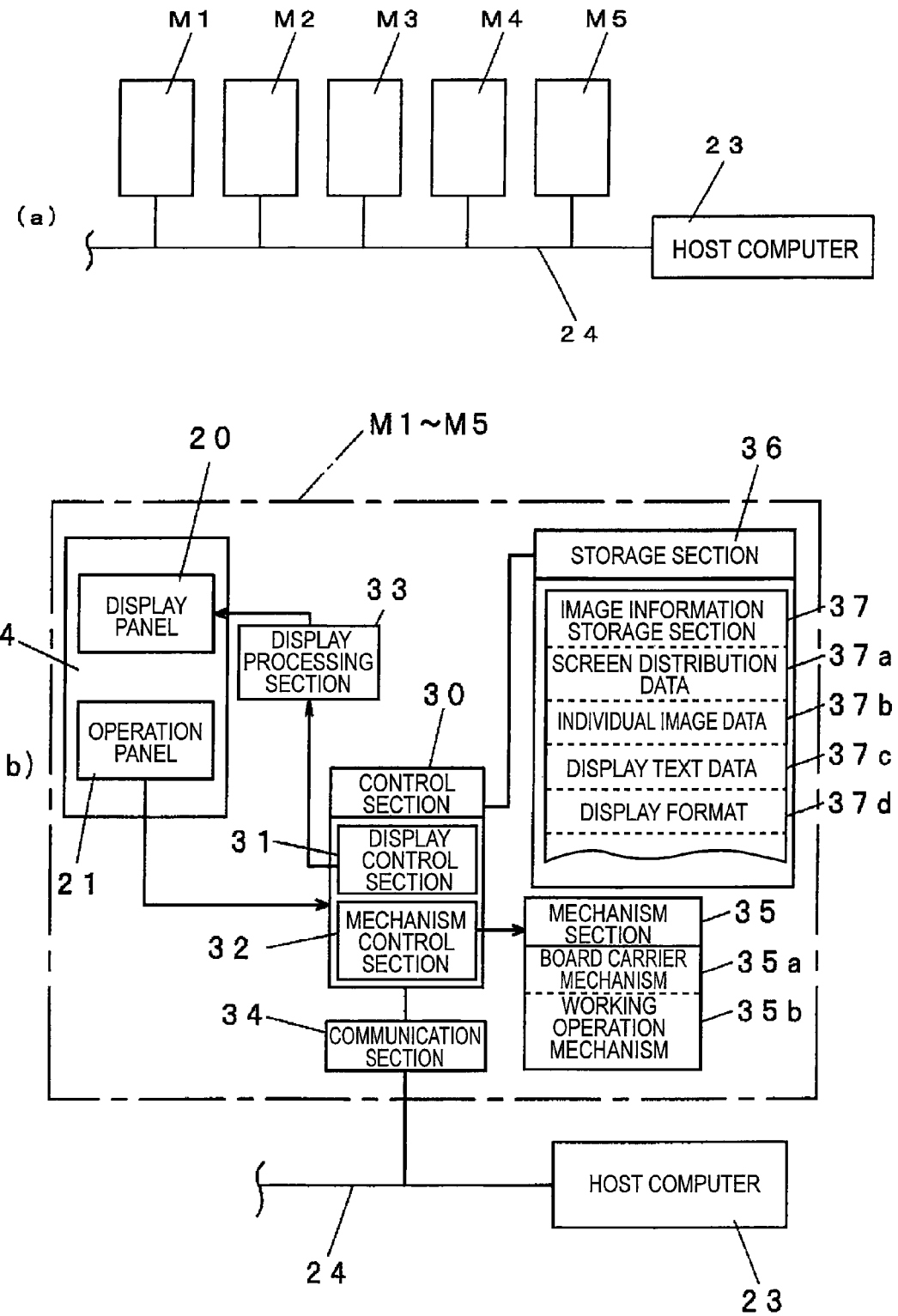
[FIG. 4] They are block diagrams showing a configuration of a control system in the electronic component mounting system of the embodiment of the present invention.
Figure 5:
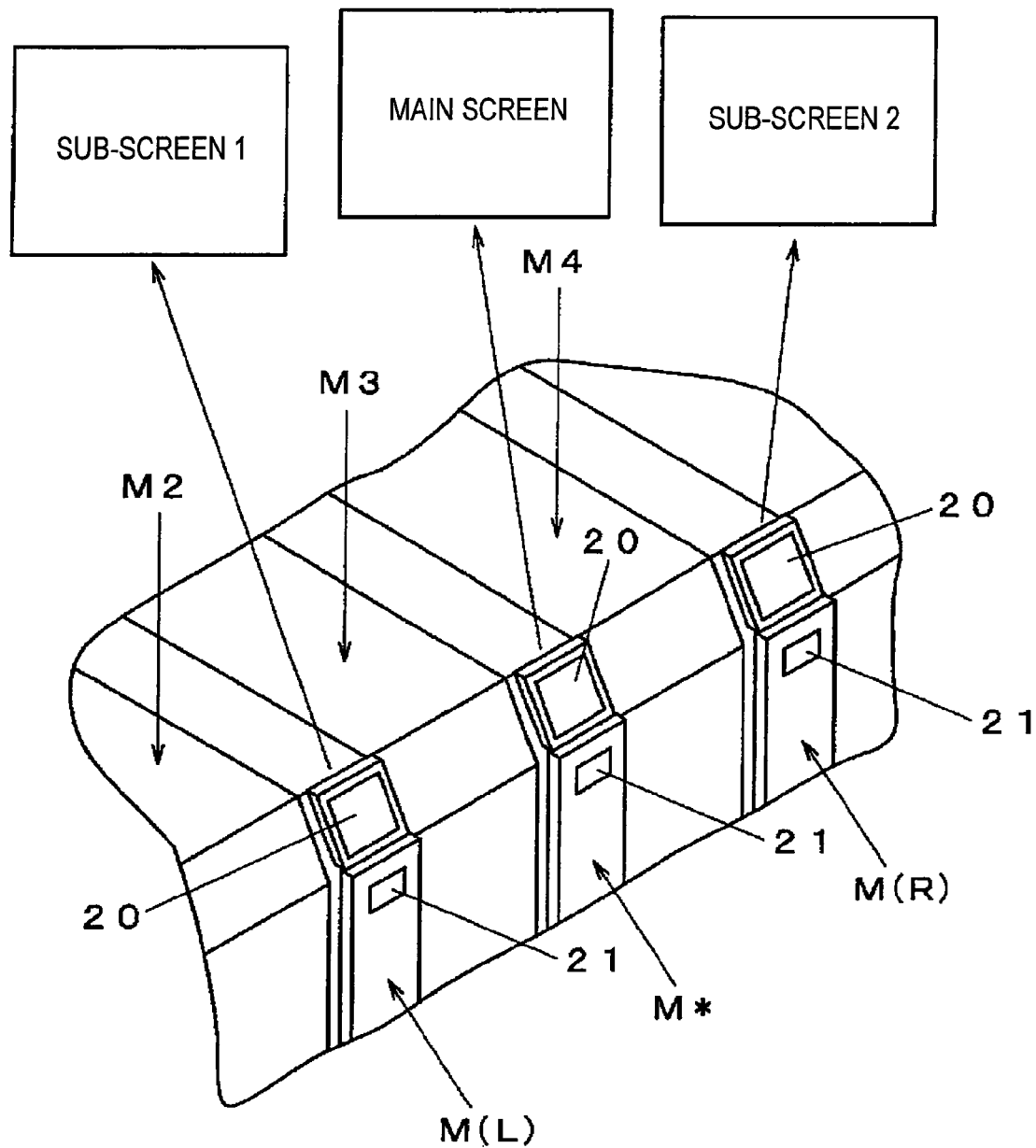
[FIG. 5] It is a descriptive view of a display mode of an operation instruction screen of the electronic component mounting system of the embodiment of the present invention.
Figure 6:
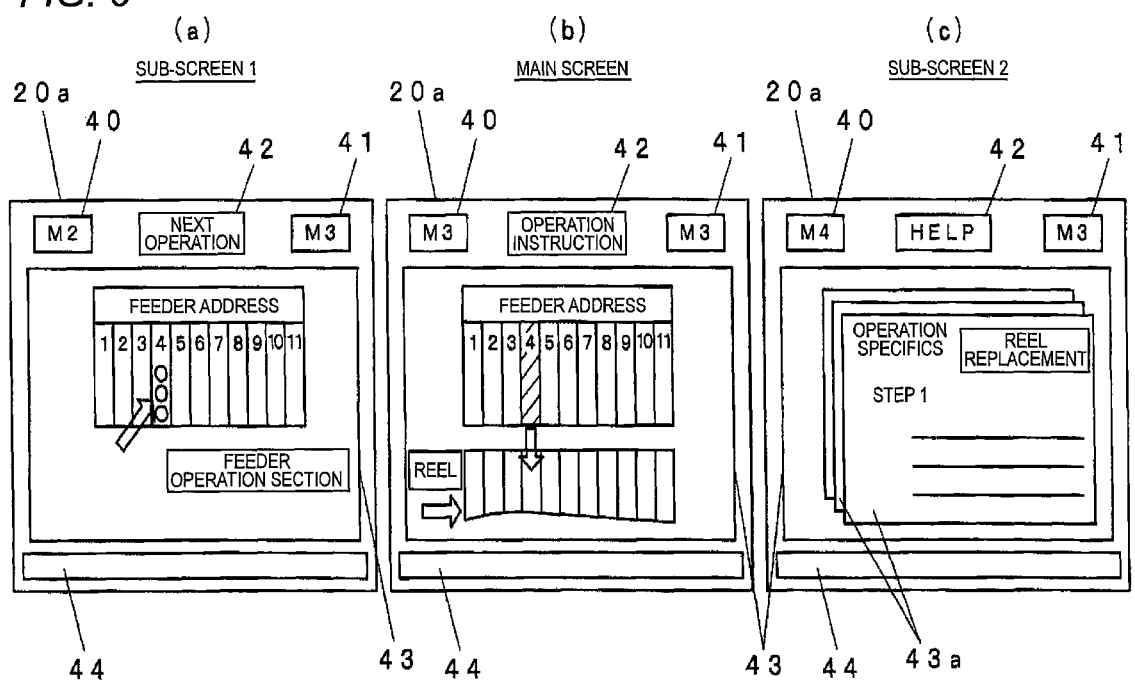
[FIG. 6] They are descriptive views of the operation instruction screen of the electronic component mounting system of the embodiment of the present invention.
Figure 7:
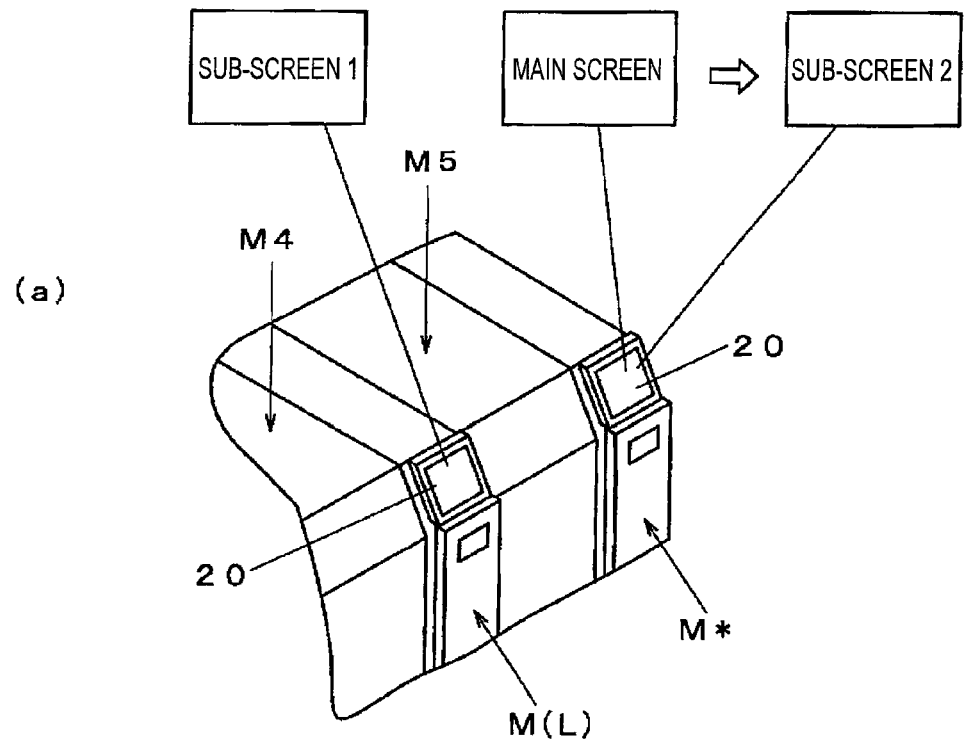
[FIG. 7] They are descriptive views of a display mode of the operation instruction screen of the electronic component mounting system of the embodiment of the present invention.
Figure 7:
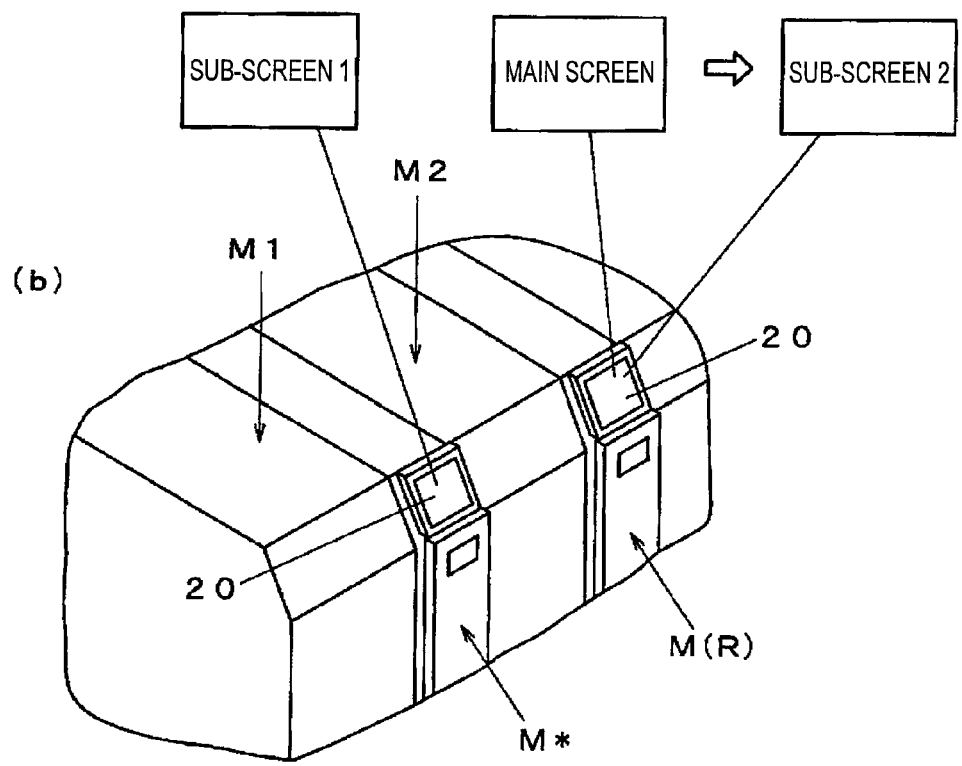

A mode for carrying out the present invention is now described by reference to the drawings. FIG. 1 is an oblique perspective view of an electronic component mounting system of an embodiment of the present invention. FIG. 2 is a plan view of electronic component mounting machines building up the electronic component mounting system of the embodiment of the present invention. FIG. 3 is a side view of the electronic component mounting machines building up the electronic component mounting system of the embodiment of the present invention. FIGS. 4(a) and 4(b) are block diagrams showing a configuration of a control system in the electronic component mounting system of the embodiment of the present invention. FIG. 5 is a descriptive view of a display mode of an operation instruction screen of the electronic component mounting system of the embodiment of the present invention. FIGS. 6(a) to 6(c) are descriptive views of the operation instruction screen of the electronic component mounting system of the embodiment of the present invention. FIGS. 7(a) and 7(b) are descriptive views of a display mode of the operation instruction screen of the electronic component mounting system of the embodiment of the present invention.

A configuration of an electronic component mounting system 1 is now described by reference to FIG. 1. The electronic component mounting system 1 is formed by interlinking electronic component mounting machines (hereinafter abbreviated simply as "machines") M1, M2, M3, M4, and M5 corresponding to a plurality of electronic component mounting devices in series. The electronic component mounting system 1 has a function of mounting electronic components on a board, thereby manufacturing a mounting board. A board, which is a target of mounting and which is supplied from an upstream side (designated by arrow "a") to the electronic component mounting system 1, is passed to a board carrier mechanism 3 by way of a carrier opening 2 provided in the machine M1 located at the most upstream position, to thus be sequentially carried through an interior of the electronic component mounting system 1 in direction X (a carrying direction of a board). The thus-carried-in board becomes an object of component mounting operation performed by the respective machines, and the board subjected to component mounting operation is further carried to downstream machines.

In the electronic component mounting system 1, the respective machines M1 to M5 are arranged in such a way that machine side surfaces MS of the respective machines, which are parallel to each other along a carrying direction of a board adjoin each other within a single vertical plane. Each of the machine side surfaces MS is provided with an operation section 4 by way of which a machine operator operates the machine and a component supply section 5 for supplying an electronic component to the machine. Each of the component supply sections 5 is equipped with tape feeders 6 for feeding electronic components and a carriage 8 holding a plurality of tape reels 7 in the form of a side-by-side arrangement. Each of the tape feeders 6 supplies a component mounting mechanism, which will be described later, with electronic components held on a carrier tape. The tape reel 7 takes up a carrier tape fed to the tape feeder 6, thereby storing the carrier tape.

The structure of each of the machines M1 to M5 is now described by reference to FIG. 2. In FIG. 2, the board carrier mechanism 3 is disposed on a base 10 in direction X. A board 9, which is supplied from an upstream machine and which becomes a target of mounting operation of a machine of interest, is carried by the board carrier mechanism 3 and positioned and held at a component mounting operation position. A component supply section 5 is disposed on either side of the board carrier mechanism 3 and equipped with a plurality of tape feeders 6. A Y-axis move table 11 equipped with a linear drive mechanism is disposed at one end of the base 10 in its X direction so as to become parallel to direction Y.

X-axis move tables 12, each of which is likewise equipped with a linear drive mechanism, is joined to the Y-axis move table 11. A mounting head 13 is provided on each of the X-axis move tables 12 so as to be freely movable in the direction X.

Each of the mounting heads 13 is a multiple head having a plurality of (eight in this embodiment) unit mounting heads 14. Each of the unit mounting heads 14 attracts and holds an electronic component by suction through use of a suction nozzle (omitted from the drawings) attached to a lower end of each of the unit mounting heads. The Y-axis move table 11 and the X-axis move tables 12 make up a head move mechanism. The mounting heads 13 are moved in both the X direction and the Y direction by means of actuating the head move mechanism, whereby each of the unit mounting heads 14 pulls an electronic component out of the tape feeder 6 of the component supply section 5 and carries the thus-pulled component to the board 9 positioned by the board carrier mechanism 3.

Therefore, the Y-axis move table 11, the first X-axis move tables 12, and the mounting heads 13 make up a component mounting mechanism that carries and mounts an electronic component to and on the board 9 by moving each of the mounting heads 13 holding electronic components (in other words, a working operation mechanism intended for performance of working operation for mounting an electronic component, in an electronic component mounting machine serving as a device for use in mounting an electronic component) through use of the head move mechanism. A component recognition device 16 is placed at a position between the component supply section 5 and the board carrier mechanism 3. When the mounting head 13 pulled an electronic component out of the component supply section 5 is moved over the component recognition device 16, the component recognition device 16 captures an image of the electronic component held by the mounting head 13, thereby recognizing the component.

A board recognition camera 15, which is on a lower surface side of the X-axis move table 12 and moved in an integrated fashion, is attached to each of the mounting heads 13. The board recognition camera 15 is moved over the board 9 positioned by the board carrier mechanism 3 as a result of movement of the mounting head 13, thereby capturing an image of the board 9, to thus recognize the board. In relation to the operation of the mounting head 13 for mounting an electronic component on the board 9, a correction is made to a mounting position in consideration of a result of recognition of the electronic component performed by the component recognition device 16 and a result of recognition of the board performed by the board recognition camera 15.

Layouts of sections in the machine side surfaces MS of the respective machines M1 to M5 are now described by reference to FIG. 3. On the machine side surface MS, the operation section 4 is positioned in a portrait orientation on the side of the component supplying section 5. A display panel 20 made up of a display device, such as a liquid-crystal panel, is placed at an upper portion of the operation section 4. The display panel 20 displays various screens including an operation instruction screen for a machine operator. An operation panel 21 by way of which the machine operator makes an operation input to a control section (a control section 30 shown in FIG. 4) is disposed below the display panel 20. Operation buttons 21a and an emergency button 21b used for making various operation inputs are arranged on the operation panel 21.

When the machine operator performs exchange of the carriage 8 or maintenance of the tape feeders 6 in the component supply section 5, the machine operator operates the tape feeders 6 and the operation buttons 21a in accordance with instruction on the operation instruction screen appearing on the display panel 20. A signal tower 22 projectingly stands on an upper cover of each of the machines M1 to M5 (see FIG. 1 too). In a case where each of the machines requires action of the machine operator, such as a case of depletion of components, a faulty machine operation, and the like, the signal tower 22 illuminates a signal lamp in a predetermined display pattern, thereby sending the machine operator a notice to the effect.

A configuration of the control system of the electronic component mounting system 1 is now described by reference to FIGS. 4(a) and 4(b). As shown in FIG. 4(a), the machines M1 to M5 are linked to a host computer 23 by way of a LAN system 24, and the host computer 23 collectively controls entire operation of the machines M1 to M5. FIG. 4(b) shows the configuration of the control system individually provided in each of the machines M1 to M5. The configuration and the function of the individual control system are described hereunder.

As shown in FIG. 4(b), each of the machines M1 to M5 has a control section 30 for carrying out a control function, a display processing section 33, a communication section 34, and a storage section 36. The control section 30 is a CPU and has a display control section 31 and a mechanism control section 32 as internal control functions. The display processing section 33 is controlled by the display control section 31, thereby performing processing for displaying image data on the display panel 20 provided in the operation section 4. The mechanism control section 32 controls operation of a board carrier mechanism 35a and a working operation mechanism 35b that make up a mechanism section 35. The machine operator operates the operation panel 21, whereby an input operation signal is input to the control section 30.

The communication section 34 is linked to the control section 30 and exchanges a signal with a control section of another machine or the host computer 23 by way of the LAN system 24. The storage section 36 stores operation programs and mounting data for letting the mechanism section 35 perform working operation, such as board carrying operation and component mounting operation. In addition, the storage section 36 is equipped with an image information storage section 37 that stores image data pertaining to an operation instruction screen appearing on the display panel 20.

The image information storage section 37 stores screen distribution data 37a, individual image data 37b, display text data 37c, and a display format 37d. The screen distribution data 37a are data for performing screen distribution processing to be described below; namely, processing for distributing specifics of an operation instruction screen used for operating a target machine to the display panels 20 of adjacent other machines as well as to the display panel 20 of the operation target machine and for letting the display panels display the distributed specifics.

Each of the machines M1 to M5 making up the electronic component mounting system 1 has a small width, and a limitation is imposed on the space of the machine side surface MS. For these reasons, a restriction is put on the size of the display panel 20, and a single display panel cannot assure sufficient display capacity. For this reason, in the present embodiment, an operation instruction screen employed when the machine operator performs operation of a specific operation target machine M* (the machine M3 in the embodiment) is distributed among the display panels 20 of the plurality of machines located within a range visible from the machine operator situated opposite the operation target machine M*, thereby letting the display panels display the screen, as shown in FIG. 5.

Specifically, the operation instruction screen is distributed among the display panel 20 belonging to the operation target machine M* and the display panels 20 belonging an adjacent machine M(L) (the machine M2 in the embodiment), and another adjacent machine M(R) (the machine M4 in the embodiment) that are located on both sides of the operation target machine M* (on the left and right sides of the machine operator situated opposite the operation target machine M*), thereby letting the display panels display the thus-distributed screens. Sufficient, required display capacity is thus assured. In the illustrated embodiment, the display panel 20 belonging to the operation target machine M* displays a main screen, and the display panels 20 belonging to the adjacent machine M(L) and the adjacent machine M(R) display a sub-screen 1 and a sub-screen 2, respectively. Thus, an operation instruction screen is made up of a total of three screens.

The individual image data 37b are image data used for displaying unit images included in the main screen, the sub-screen 1, and the sub-screen 2 that make up the operation instruction screen. The display text data 37c are data for expressing operation instruction and explanations about an image in text on the main screen, the sub-screen 1, and the sub-screen 2, respectively. The display format 37d is data for letting the respective display panels 20 display a unit image and a text display as the main screen, the sub-screen 1, and the sub-screen 2 in a specified pattern.

When operation intended for a specific machine is required during operation of the electronic component mounting system 1; for instance, when depletion of components or faulty machine operation is reported by means of the signal tower 22, the machine operator makes access to the machine issued the notice and operates the operation buttons 21 a of the operation panel 21. By means of the operation input, the control section 30 of the machine of interest ascertains that the machine of interest is the operation target machine M* and performs display processing for displaying a required operation instruction screen.

In accordance with instruction of the operation instruction screen, the machine operator performs required operation or maintenance operation in connection with the operation target machine M*. During display processing, the display control section 31 of the operation target machine M* reads data required to display an operation instruction screen from the image information storage section 37; namely, the screen distribution data 37a, the individual image data 37b, the display text data 37c, and the display format 37d. The display processing section 33 of the operation target machine M* is controlled in accordance with these sets of data, whereby a main screen of the operation instruction screen is displayed on the display panel 20 of the operation target machine M*.

The display control section 31 of the operation target machine M* transmits a sub-screen display signal to the control sections of the adjacent machines M(L) and M(R) by way of the LAN system 24, whereby the adjacent machines M(L) and M(R) perform display processing for letting the display panels 20 of the respective machines display the sub-screen 1 and the sub-screen 2. Specifically, the display control sections 31 of the adjacent machines M(L) and M(R) read data required to display the sub-screen 1 and the sub-screen 2, among the data stored in the image information storage sections 37 of the respective machines, and control the display sections 33 of the adjacent machines M(L) and M(R) in accordance with the thus-read data, whereby the display panels 20 of the respective adjacent machines M(L) and M(R) display the sub-screen 1 and the sub-screen 2.

Various variations on the mode for storing image information used for displaying an operation instruction screen are available. Specifically, as descried in connection with the present embodiment, when the electronic component mounting system 1 is formed solely from machines of the same type (electronic component mounting machines), all pieces of image information are stored as common data in the image information storage sections 37 of the respective machines M1 to M5. When the electronic component mounting system 1 is formed from a plurality of different types of machines, different pieces of image information commensurate with the types of the machines can also be stored in the image information storage sections 37 of the respective machines. Further, all pieces of image information can also be stored, as a database, in a storage section of the host computer 23 that collectively controls the entirety of the electronic component mounting system 1. In this case, a storage device of the host computer 23 acts as a storage section for storing image data pertaining to an operation instruction screen displayed on the display panel 20.

FIGS. 6(a), 6(b), and 6(c) show example specifics of the operation instruction screen to be thus displayed. FIGS. 6(a), 6(b), and 6(c) show example operation instruction screens displayed on the three screens; namely, the main screen, the sub-screen 1, and the sub-screen 2, in a distributed manner in sequence viewed from the machine operator. The sub-screen 1 shown in FIG. 6(a) is displayed on the display panel 20 of the adjacent machine M(L); the main screen shown in FIG. 6(b) is displayed on the display panel 20 of the operation target machine M*; and the sub-screen 2 shown in FIG. 6(c) is displayed on the display panel 20 of the adjacent machine M(L). Distribution of the screen is carried out in accordance with the screen distribution data 37a. FIGS. 6(a), 6(b), and 6(c) show examples in which the operation target machine M* is the machine M3 and in which the adjacent machine M(L) and the adjacent machine M(R) correspond to the machine M2 and M4, respectively, as shown in FIG. 5.

A screen configuration of the main screen, the sub-screen 1, and the sub-screen 2 is basically common, and necessary information is displayed in; for instance, a layout such as that displayed below, in accordance with the display format 37d stored in the image information storage section 37. In a screen 20a of each of the display panels 20, an assigned machine display pane 40 for displaying the name of a machine to which the display panel 20 belongs, an operation target machine display pane 41 for displaying a machine to be operated (the machine M3 in the embodiment), and a specifics-to-be-displayed display pane 42 for distinguishing specifics to be displayed on a screen from each other are arranged along an upper edge of the screen 20a. An instruction screen display pane 43 for displaying instruction specifics in the form of an image, a drawing, or a text is placed at a center area of the screen 20a. A tool bar 44 used for performing various operations, such as switching of a screen on the screen 20a, is placed along a lower edge of the screen 20a. An image for illustrating working specifics and explanatory statements serving as a HELP indication are displayed in the instruction screen display pane 43 in accordance with the individual image data 37b and the display text data 37c.

The main screen shown in FIG. 6(b) is now described. "Work instruction" showing that the main screen is a screen for providing instruction of a work to be performed at that point in time is displayed in the specifics-to-be-displayed display pane 42, and an image showing example specifics of the work instruction (replacement of the tape reel 7 in the component supply section 5 is provided by way of example in the embodiment) is displayed in the instruction image display pane 43. "HELP" showing that the sub-screen 2 is a screen for explaining a specific work in text is displayed in the specifics-to-be-displayed display pane 42 on the sub-screen 2 shown in FIG. 6(c). HELP specifics; namely, specific works to be performed (replacement of a reel incidental to depletion of components), are displayed in the instruction screen display panes 43 in sequence 1, 2, . . . , by means of a plurality of display sheets 43a. The display sheets 43a can sequentially be switched by means of operation of the tool bars 44.

By reference to such a main screen and a sub-screen 2, the machine operator immediately understands that a work for replacing the tape reel 7 at a feeder address 4 of the component supply section 5 is instructed in the machine M3 that is the operation target machine M*. When the work is performed, the instructed work can appropriately be performed while a work position, work procedures, and a notice for performance of the work are comprehended, by reference to instructions in the image appearing on the main screen and the "HELP" appearing on the sub-screen 2.

"Next operation" is displayed in the specifics-to-be-displayed display pane 42 on the sub-screen 1 shown in FIG. 6(a). Specifics to be displayed, which are displayed on the instruction screen display pane 43, are indicated as being operation specifics to be performed after performance of the work instructed on the main screen and the sub-screen 2. In connection with the tape feeder 6 located at the feeder address 4 after replacement of the reel, it is previously displayed that button operation incidental to attachment of a new carrier tape should be performed. The machine operator thereby can start the work after having previously comprehended operation specifics to be performed after performance of the instructed work. An operation error attributable to insufficient comprehension of the work specifics can be diminished.

The examples shown in FIG. 5 and FIGS. 6(a), 6(b), and 6(c) show the case where the adjacent machines M(L) and M(R) are situated on both sides of the operation target machine M*. When the operation target machine M* is situated at the top or end of a plurality of machines making up the electronic component mounting system 1, an adjacent machine is situated only on one side of the operation target machine. The operation instruction screen display mode involving simultaneous use of the three display panels 20 cannot be implemented. Accordingly, in such a case, a display mode, such as that shown in FIGS. 7(a) and 7(b), is adopted.

As shown in FIG. 7(a), when the operation target machine M* is the machine M5 located at the end, the sub-screen 1 is displayed on the display panel 20 belonging to the adjacent machine M(L) in the same manner as in the example shown in FIG. 5. The main screen and the sub-screen 2 are displayed in a switchable manner on the display panel 20 belonging to the operation target machine M* by operation of a changeover button provided in the tool bar 44. As shown in FIG. 7(b), when the operation target machine M* is the top machine Ml, the sub-screen 1 is displayed on the display panel 20 belonging to the operation target machine M*. The main screen and the sub-screen 2 are switchably displayed on the display panel 20 belonging to the adjacent machine M(R) by operation of the changeover button provided in the tool bar 44.

Specifically, in such a case, a plurality of operation instruction screens are displayed while being sequentially switched, by use of the display panel 20 belonging to the operation target machine M* and the display panel 20 belonging to at least one of the two adjacent machines M(L) and M(R) adjacently provided on both sides of the operation target machine M*. In an embodiment shown in FIGS. 7(a) and 7(b), a screen distribution mode setting is made in such a way that the sequence of arrangement of the main screen, the sub-screen 1, and the sub-screen 2 becomes analogous to that described in connection with the embodiment shown in FIG. 5 and FIGS. 6(a), 6(b), and 6(c). The sequence of arrangement is arbitrary and may freely set according to convenience in operation of the electronic component mounting machine.

In relation to the above configuration, the electronic component mounting machine serving as a device for mounting an electronic component is formed from a working operation mechanism 35b that performs working operation for mounting an electronic component; a control section 30 that controls the working operation mechanism 35b; the operation section 4 that is placed on the machine side surface MS parallel to the board conveying direction and that is equipped with the display panel 20 which displays a display screen including an operation instruction screen for a machine operator and the operation panel 21 by way of which the machine operator makes an operation input to the control section 30; the storage section 36 that stores image data pertaining to an operation instruction screen to be displayed on the display panel 20; and the display processing section 33 that displays image data stored in the storage section 36 on the display panel 20.

The control section 30 is further provided with the display control section 31 serving as display control means. The display control section 31 controls the display processing section 33, whereby the operation instruction screen appears on the display panels 20 of the respective machines in the electronic component mounting system 1. Necessary operation instruction is thereby given to the machine operator. Under the operation instruction method for the electronic component mounting system 1, an operation instruction screen pertaining to the operation target machine M* is displayed in a preset display format on at least two display panels 20 including the display panel 20 belonging to the operation target machine M*, which is a target to be operated by the machine operator, among the plurality of machines M1 to M5 and the display panel 20 belonging to at least one of the two adjacent machines M(L) and M(R) adjacently provided on both sides of the operation target machine M*.

In the present embodiment, the display control section 31 is provided in the control section 30 of each of the machines M1 to M5. The display control means is individually provided in the plurality of electronic component mounting machines. As shown in FIG. 4(a), when the electronic component mounting system 1 has the host computer 23 for collectively controlling the machines M1 to M5, the functions of the display control sections 31 may also be given to the host computer 23. In this case, the display control means is provided in the host computer 23 that collectively controls the plurality of electronic component mounting machines.

Even in a facility in which small, thin unit machines, each of which has a small display panel, are interlinked, a screen having a sufficient volume of information can be displayed, so long as the electronic component mounting system 1 including a plurality of interlinked machines adopts such an operation instruction method. Therefore, even when an inexperienced machine operator is assigned as a machine operator, it is possible to provide accurate operation instruction by displaying, on the display panel 20, an operation instruction screen in a sufficient volume of information.

In the embodiment, the main screen displays specifics of "work instruction"; the sub-screen 1 displays specifics of "next operation"; and the sub-screen 2 displays specifics of "HELP," as shown respectively in FIGS. 6(a), 6(b), and 6(c). There is further illustrated an embodiment in which the sub-screen 1, the main screen, and the sub-screen 2 are displayed in this sequence from left when viewed from the machine operator. The present invention, however, is not limited to the specifics to be displayed and the arrangement sequence. Specifics to be displayed and arrangement sequence can also be freely set in accordance with convenience in operation of the electronic component mounting apparatus.

In the exemplification shown in the embodiment, the electronic component mounting machines that perform component mounting operation for mounting electronic components on a board is described as an example device for use in mounting an electronic component. The present invention, however, can also be applied to a solder printing apparatus that prints on a board solder for use in bonding electronic components, an inspection apparatus that inspects a board, and the like, so long as the apparatus makes up an electronic component mounting system.

The present invention has been described in detail by reference to the specific embodiment. However, it is also manifest to those skilled in the art that the present invention be susceptible to various alterations or modifications without departing the spirit and scope of the present invention.

The present patent application is based on Japanese Patent Application (JP-A-2007-263077) filed on Oct. 9, 2007 in Japan, the entire subject matter of which is incorporated herein by reference.

INDUSTRIAL APPLICABILITY

An electronic component mounting system of the present invention and an operation instruction method for the system yield an advantage of the ability to provide accurate operation instruction by displaying an operation instruction screen on a display panel in required, sufficient amount of information, and are useful in an electronic component mounting system formed by interlinking a plurality of machines.

The invention claimed is:

1. A method for an electronic component mounting system configured to display accurate operation instructions, to a machine operator, and to mount electronic components on a board, wherein the electronic component mounting system comprises a plurality of electronic component mounting machines interlinked in series, the method comprising:

retrieving from a storage unit, by a first machine of the plurality of electronic component mounting machines, first image information utilized to display an operation instruction screen to the machine operator;

displaying, on a first display panel of the first machine, a main screen of the operation instruction screen, which comprises the main screen and one or more sub-screens, in accordance with the first image information;

retrieving from the storage unit, by at least one machine adjacent to the first machine, second image information utilized to display the one or more sub-screens; and displaying, on a respective display panel of the at least one machine adjacent to the first machine, the one or more sub-screens in accordance with the second image information.

2. The method of claim 1, further comprising transmitting, from the first machine to the at least one machine adjacent, a signal instructing display of the one or more sub-screens.

3. The method of claim 1, further comprising switchably displaying, on the first display panel, the main screen and a first sub-screen of the one or more sub-screens.

* * * * *